(12) United States Patent
London

(10) Patent No.: US 6,414,508 B1
(45) Date of Patent: Jul. 2, 2002

(54) METHODS FOR PREDICTING RELIABILITY OF SEMICONDUCTOR DEVICES USING VOLTAGE STRESSING

(75) Inventor: Arnie London, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/557,747

(22) Filed: Apr. 25, 2000

Related U.S. Application Data

(60) Provisional application No. 60/141,495, filed on Jun. 28, 1999.

(51) Int. Cl.$^7$ .............................................. G01R 31/28
(52) U.S. Cl. .................... 324/765; 324/158.1; 714/724; 714/1
(58) Field of Search ............................. 324/765, 158.1; 714/724, 1–10; 209/118

(56) References Cited

U.S. PATENT DOCUMENTS

| | | | | | |
|---|---|---|---|---|---|
| 5,519,333 | A | * | 5/1996 | Righter | 324/765 |
| 5,521,524 | A | * | 5/1996 | Houston | 324/765 |
| 5,742,177 | A | * | 4/1998 | Kalb, Jr. | 324/765 |
| 5,889,408 | A | * | 3/1999 | Miller | 324/765 |
| 6,175,812 | B1 | * | 1/2000 | Boyington et al. | 702/118 |
| 6,140,832 | A | * | 10/2000 | Vu et al. | 324/765 |
| 6,147,316 | A | * | 11/2000 | Beffa | 209/573 |
| 6,175,244 | B1 | * | 1/2001 | Gattiker et al. | 324/765 |
| 6,230,293 | B1 | * | 5/2001 | Chittipeddi et al. | 714/724 |

\* cited by examiner

*Primary Examiner*—Safet Metjahic
*Assistant Examiner*—Jimmy Nguyen
(74) *Attorney, Agent, or Firm*—Martine & Penilla, LLP

(57) ABSTRACT

Disclosed are methods for predicting reliability of semiconductor devices and wafers without a lengthy burn-in process. A set of semiconductor devices is obtained for testing. Each semiconductor device is capable of being electrically tested to measure one or more critical parameters that indicate potential failure of associated semiconductor device. On each of the semiconductor devices, a set of electrical tests is performed to obtain a failure result for the critical parameter(s) of each of the semiconductor devices. The set of electrical tests is performed both before and after stressing each of the semiconductor devices with an elevated voltage above a normal operating voltage for the semiconductor devices. For the set of semiconductor devices, a failure rate is determined from the failure results of the semiconductor devices. The failure rate indicates a probability of failure for the entire set of semiconductor devices.

24 Claims, 10 Drawing Sheets

METHODS FOR PREDICTING RELIABILITY OF SEMICONDUCTOR DEVICES USING VOLTAGE STRESSING

CROSS REFERENCE TO RELATED APPLICATION

The present application claims priority benefit of U.S. Provisional Application No. 60/141,495, filed on Jun. 28, 1999, which is incorporated herein by reference.

BACKGROUND OF THE INVENTION

1. Field of the Invention

This invention relates generally to testing of semiconductor devices, and more particularly to methods for predicting reliability of semiconductor devices.

2. Description of the Related Art

In semiconductor device manufacturing, it is important for integrated circuit (IC) producers to identify potential reliability problems as early as possible in the manufacturing process. Identifying reliability problems at an early stage protects consumers from receiving unreliable products. As end-user system complexity grows, the need to identify potential problems associated with integrated circuit devices becomes even more important.

One common method used to identify problems in semiconductor devices is a burn-in (BI) test. In a burn-in process, a semiconductor device is packaged and put into a socket mounted on a PC board. The PC board is then placed in an oven at an elevated temperature (e.g., 125° C. ambient temperature). In a process called static burn-in process, the semiconductor device is powered up but not electrically exercised, and left in the oven at the elevated temperature. In a dynamic burn-in process, on the other hand, the semiconductor device is powered up and electrically exercised in a manner in which it might operate in the field.

Conventional burn-in tests are generally used to accelerate failures latent in the semiconductor devices in order to identify defective products sooner. For example, the burn-in tests have been routinely used to detect early life failures of semiconductor devices before shipping to customers. Some devices such as memory devices will typically undergo 100 percent burn-in for a day or so prior to shipment. This means that every device is subjected to the burn-in test. It is expensive to burn-in all semiconductor devices that are made. For many devices, only a sample of the semiconductor devices may be tested by the burn-in process.

Unfortunately, a typical burn-in process is a lengthy process that requires costly infrastructures to implement. In particular, performing a burn-in test on semiconductor devices can take hundreds of hours or even thousands of hours depending on the amount of field operation the manufacturer wishes to simulate, which can translate into several weeks in time. This delays semiconductor devices from reaching the market by a substantial amount of time. In addition, burn-in tests are often expensive because they require an expensive testing infrastructure such as oven and other testing equipment. Furthermore, burn-in processes require additional handling of the semiconductor devices that can cause deleterious effects on the devices.

Thus, what is needed is a method for efficiently predicting reliability of semiconductor devices without the lengthy delay and high cost associated with conventional burn-in tests.

SUMMARY OF THE INVENTION

Broadly speaking, the present invention fills these needs by providing methods for evaluating and predicting reliability of semiconductor devices using voltage stressing. It should be appreciated that the present invention can be implemented in numerous ways, including as a process, an apparatus, a system, computer readable media, or a device. Several inventive embodiments of the present invention are described below.

In one embodiment, the present invention provides a method for predicting reliability of semiconductor devices without undergoing a burn-in process. In this method, a set of semiconductor devices is obtained for testing. Each semiconductor device is capable of being tested to measure one or more critical parameters that may indicate field failure of the associated semiconductor device. On each of the semiconductor devices, a set of electrical tests is performed to obtain a failure result for the one or more critical parameters of each of the semiconductor devices. The set of electrical tests is performed both before and after stressing each of the semiconductor devices with an elevated voltage above a normal operating voltage for the semiconductor devices. For the set of semiconductor devices, a critical parameter failure rate is determined from the electrical test results of the semiconductor devices. The failure rate indicates a probability of failure for the entire set of semiconductor devices.

In another embodiment, the present invention provides a method for evaluating a failure rate of semiconductor wafers containing a plurality of semiconductor devices. A semiconductor wafer is selected for testing. Each semiconductor device in the selected semiconductor wafer is capable of being tested for measuring one or more critical parameters that may indicate field failure of the associated semiconductor device. For each of the semiconductor devices in the selected semiconductor wafer, the associated the one or more critical parameters are measured under a normal operating voltage for the semiconductor devices. In addition, an elevated voltage above the normal operating voltage is applied to each of the semiconductor devices for a specified period of time. The one or more associated critical parameters is then measured after applying the elevated voltage. The one or more measured critical parameters are then compared to obtain a failure result when the one or more critical parameters measured after applying the elevated voltage are not approximately equal to the one or more critical parameters measured before applying the elevated voltage. For the selected semiconductor wafer, a failure rate is determined from the electrical test (e.g., wafer sort) results of the associated semiconductor devices to indicate a probability of failure for the selected semiconductor wafer.

In yet another embodiment, disclosed is a method for evaluating a failure rate of a wafer lot having a set of semiconductor wafers. Each semiconductor wafer contains a plurality of semiconductor devices. For each semiconductor wafer in the wafer lot, the method includes: (a) selecting a semiconductor wafer for testing, wherein each semiconductor device in the selected semiconductor wafer is capable of being tested for measuring one or more critical parameters that may indicate field failure of the associated semiconductor device; (b) for each of the semiconductor devices in the selected semiconductor wafer, (b1) measuring the one or more associated critical parameters under a normal operating voltage for the semiconductor devices; (b2) applying an elevated voltage above the normal operating voltage to each of the semiconductor devices for a specified period of time; (b3) measuring the one or more associated critical parameters after applying the elevated voltage; (b4) comparing the one or more measured critical parameters to obtain a failure result when the one or more critical parameters measured after applying the elevated voltage are not approximately equal to the one or more critical parameters measured before applying the elevated voltage; and (b5) determining a failure rate for the associated semiconductor wafer from the electrical test (e.g., wafer sort) results of the semiconductor devices, wherein the failure rate indicates a probability of failure for the associated semiconductor wafer; and (c) determining an overall failure rate for the wafer lot from the failure rate of the semiconductor wafers, wherein the overall failure rate indicates a probability of failure for the entire wafer lot.

Preferably, the critical parameter is a quiescent leakage current of the semiconductor devices although other electrical parameters may also have predictive value. The measurement and evaluation of critical parameters before and after voltage stressing not only serve as an effective early predictor of product operating life reliability but also substantially reduce the time in evaluating the reliability of semiconductor devices and wafers. Additionally, the use of voltage stressing in conjunction with before and after values of critical parameters allows more rapid determination of the correlation between wafer level results and assembled product reliability when performing dynamic operating life tests. Accordingly, the present invention minimizes cost and time in the manufacturing flow without potentially deleterious effects of added handling caused by conventional burn-in processes. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

The present invention provides methods for evaluating and predicting the reliability of semiconductor devices and wafers using voltage stressing. It will be obvious, however, to one skilled in the art, that the present invention may be practiced without some or all of these specific details. In other instances, well known process operations have not been described in detail in order not to unnecessarily obscure the present invention.

The present invention provides methods for predicting the reliability of semiconductor devices and wafers without the delay associated with the conventional burn-in process by using a voltage stressing and measuring critical parameters such as quiescent leakage currents. Before applying the voltage stressing, a critical parameter that indicates failure of each semiconductor device is measured. This critical parameter, or parameters, is part of the sequence of electrical tests performed as part of the manufacturing operation. Then, the semiconductor devices are put through voltage stressing at an elevated voltage for a specified time. Once the semiconductor devices have been subject to voltage stressing, the critical parameter(s) for each of the semiconductor devices is measured again. A device is identified as being defective if the critical parameter measured before and after voltage stressing is not approximately equal or if the measured value is outside the limit defined as passing the electrical test. A failure rate for a set of the semiconductor devices is then determined from the failure results of each of the semiconductor devices. The failure rate indicates a probability of failure for the entire set of semiconductor devices in actual field operation.

Figure 1:
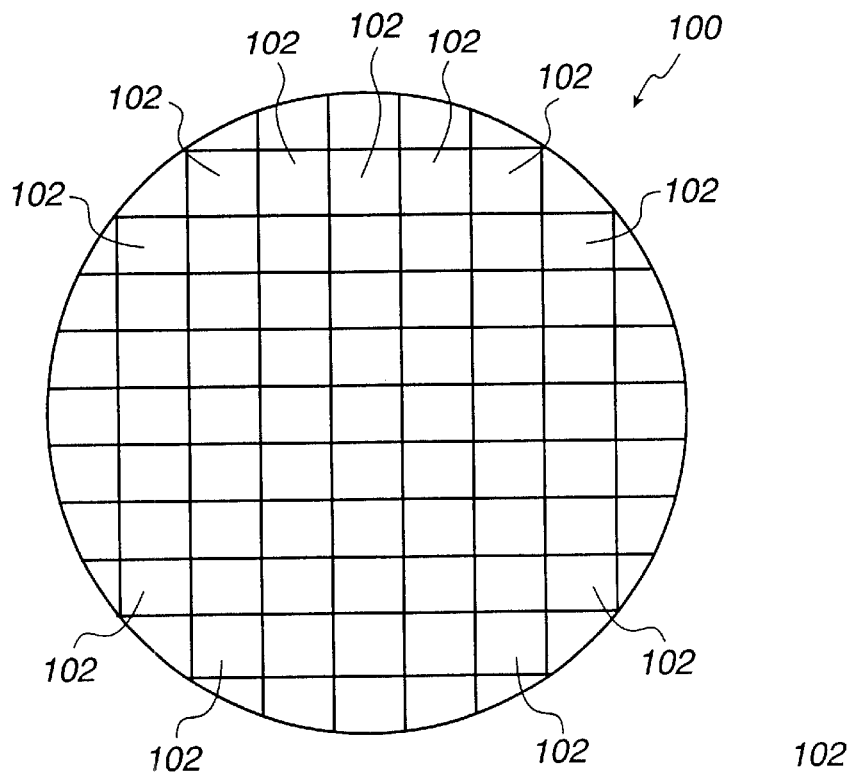
FIG. 1 illustrates an overview schematic diagram of an exemplary semiconductor wafer.

Reliability evaluations for predicting failures of the present invention may be performed at the packaged semiconductor device level, the individual wafer level, or wafer lot level, although the earliest available point in the manufacturing process, wafer sort, is most cost effective. FIG. 1 illustrates an overview schematic diagram of an exemplary semiconductor wafer 100. The semiconductor wafer 100 includes a plurality of semiconductor devices 102 that can be tested individually. As is well known in the art, the semiconductor devices 102 may be in the form of semiconductor chips or dice.

Figure 2:
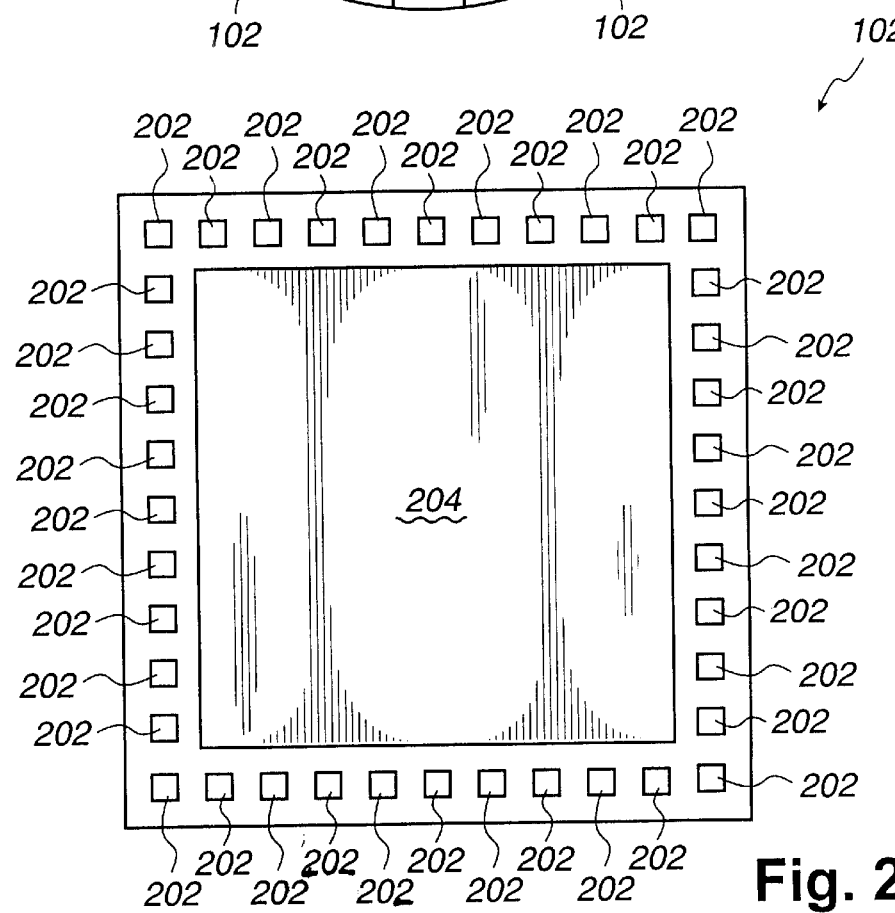
FIG. 2 shows a more detailed schematic diagram of an exemplary semiconductor device.

FIG. 2 shows a more detailed schematic diagram of an exemplary semiconductor device 102. The semiconductor device 102 includes an integrated circuit portion 204 and a plurality of bonding pads 202. The bonding pads 202 are used to provide electrical contact to the package leads. For example, testing probes may be electrically connected to the bonding pads 202 for applying input signals and measuring output signals. It is the use of such probes that permits electrical evaluation to be performed at wafer level.

Figure 3:
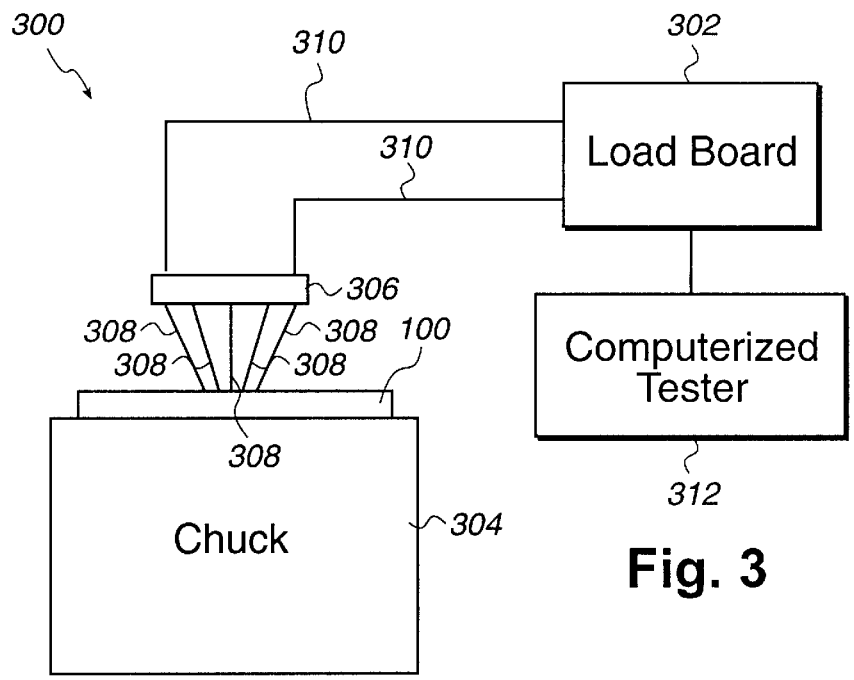
FIG. 3 illustrates an exemplary testing apparatus for testing the semiconductor devices on the semiconductor wafer in accordance with one embodiment of the present invention.

FIG. 3 illustrates an exemplary testing apparatus 300 for testing the semiconductor devices 102 on the semiconductor wafer 100 in accordance with one embodiment of the present invention. The testing apparatus 300 includes a load board 302, a probe card 306, a chuck 304, a plurality of probes 308, and a computerized tester 312. Disposed on the chuck 304 is the semiconductor wafer 100 for testing. The probes 308 are attached to the probe card 306 and are configured to make electrical contact with a semiconductor device 102 for testing. The probe card 306 is electrically coupled to the load board 302, which directs signals from the tester 312 to appropriate pins on probe card 306. For example, the load board 302 provides input signals to one or more probes 308 and receives output signals from one or more probes 308.

The tester 312 is coupled to the load board 302 to receive measured output signals and provide one or more associated input signals. From these inputs, the tester 312 evaluates the performance of the semiconductor device and can also process failure and reliability data of the semiconductor devices 102 on the semiconductor wafer 100 to predict its reliability at the device level, wafer level, or wafer lot level. In one embodiment, the tester 312 may be implemented using a processor and a memory for storing data and programs for analyzing failure data.

Figure 4:
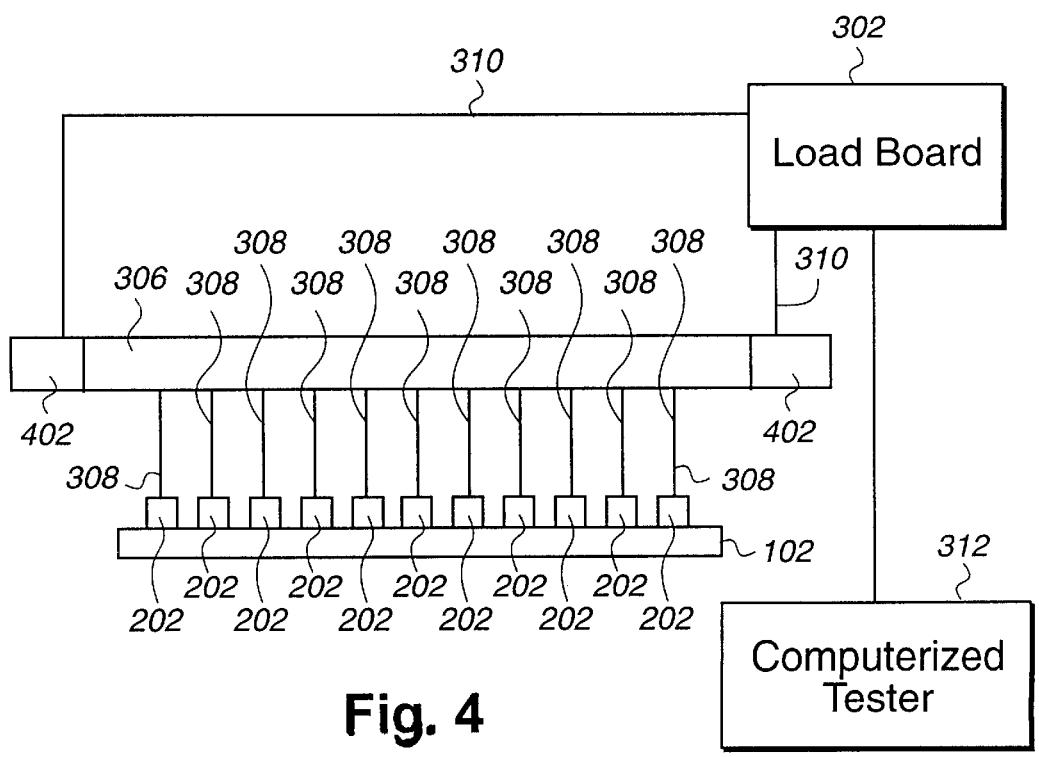
FIG. 4 shows a more detailed schematic diagram of an exemplary semiconductor device being tested for reliability in accordance with one embodiment of the present invention.

FIG. 4 shows a more detailed schematic diagram of an exemplary semiconductor device 102 being tested for reliability in accordance with one embodiment of the present invention. As shown, the probe card 306 includes an edge connector 402 for connecting to the load board 302 via electrical lines 310. Formed over the semiconductor device 102 is a plurality of bonding pads 202, which provide electrical connection to internal circuit elements in the semiconductor device 102. These bonding pads 202 are electrically connected to the probes 308 for receiving input signals and providing output signals. In this configuration, the load board 302 applies electrical input signals to the semiconductor device 102 through the probe card 306 for testing. As each individual semiconductor device 102 is tested, the load board 302 receives one or more output signals through one or more probes 308. The tester 312 receives electrical testing results and processes the testing result to generate electrical passing and failure data, which is used to determine good and bad devices and, through this invention, predict parameters such as reliability, failure rate, and other relevant statistics.

Figure 5A:
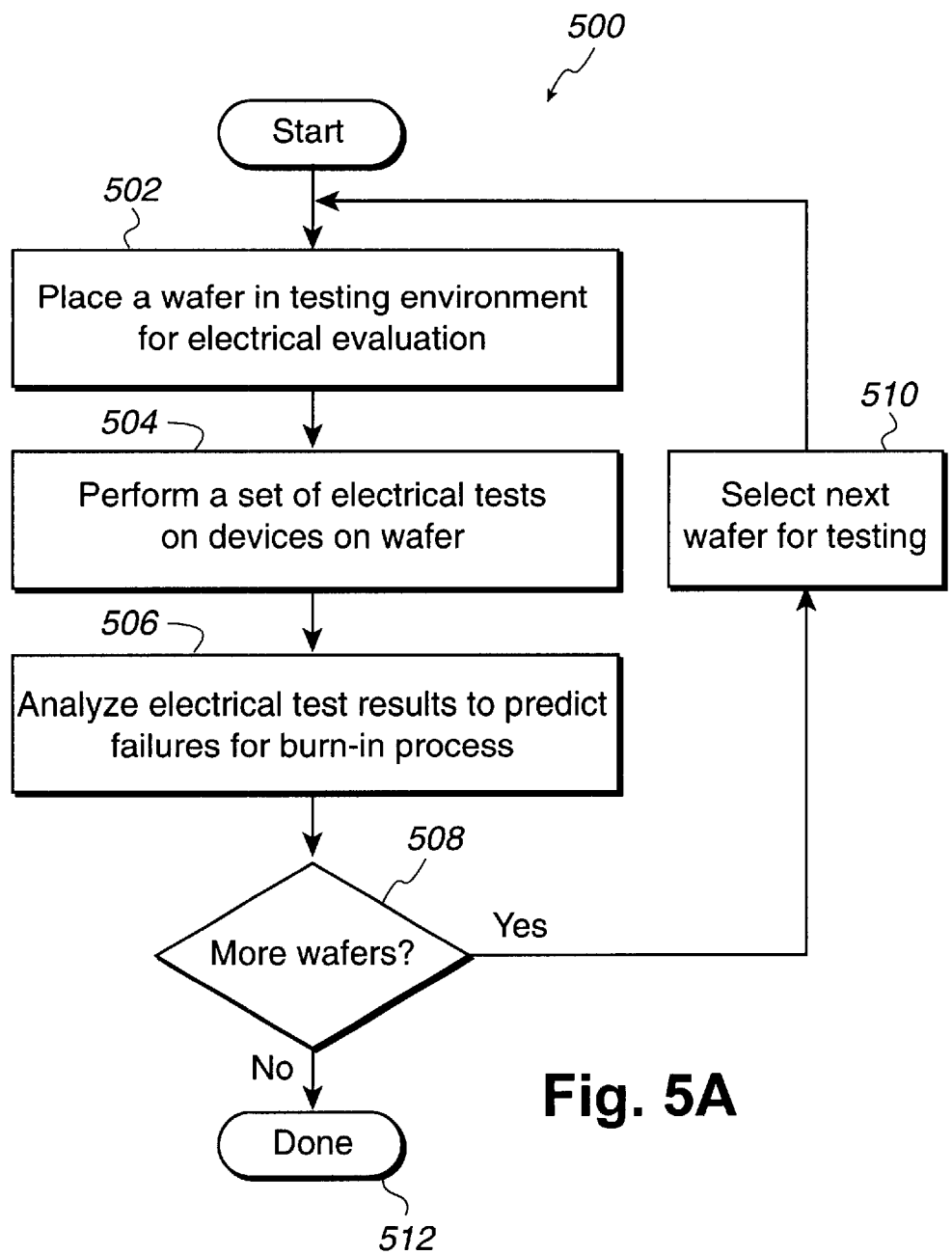
FIG. 5A illustrates a flowchart of a method for predicting failures while performing wafer electrical evaluation at an individual wafer level in accordance with one embodiment of the present invention.

In accordance with one embodiment of the present invention, FIG. 5A illustrates a flowchart of a method 500 for electrically evaluating semiconductor devices and predicting failures at an individual wafer level in accordance with one embodiment of the present invention. In this method, a wafer to be tested is placed in a testing environment such as the testing apparatus 300 for electrical evaluation. A set of electrical tests is then performed on the devices on the wafer in operation 502. Preferably, each device on the wafer is tested individually. Then in operation 506, the electrical test results of the wafer are analyzed to predict failures which may occur during a burn-in process for the tested wafer. In one embodiment, based on the number of devices that have failed the failure tests and the total number of tested devices, a failure rate (i.e., percentage) of failed devices in the wafer is determined. As will be discussed in more detail below, the evaluated failure rate provides substantially accurate prediction for the reliability of devices on tested wafers.

All wafers in a wafer lot are electrically tested in this manner to determine which devices perform to the device specifications and should be assembled. A by-product of these electrical results is that they can be used, in accordance with one embodiment of the present invention, to predict the reliability of the assembled devices. After all wafers have been tested, the method terminates in operation 512.

Figure 5B:
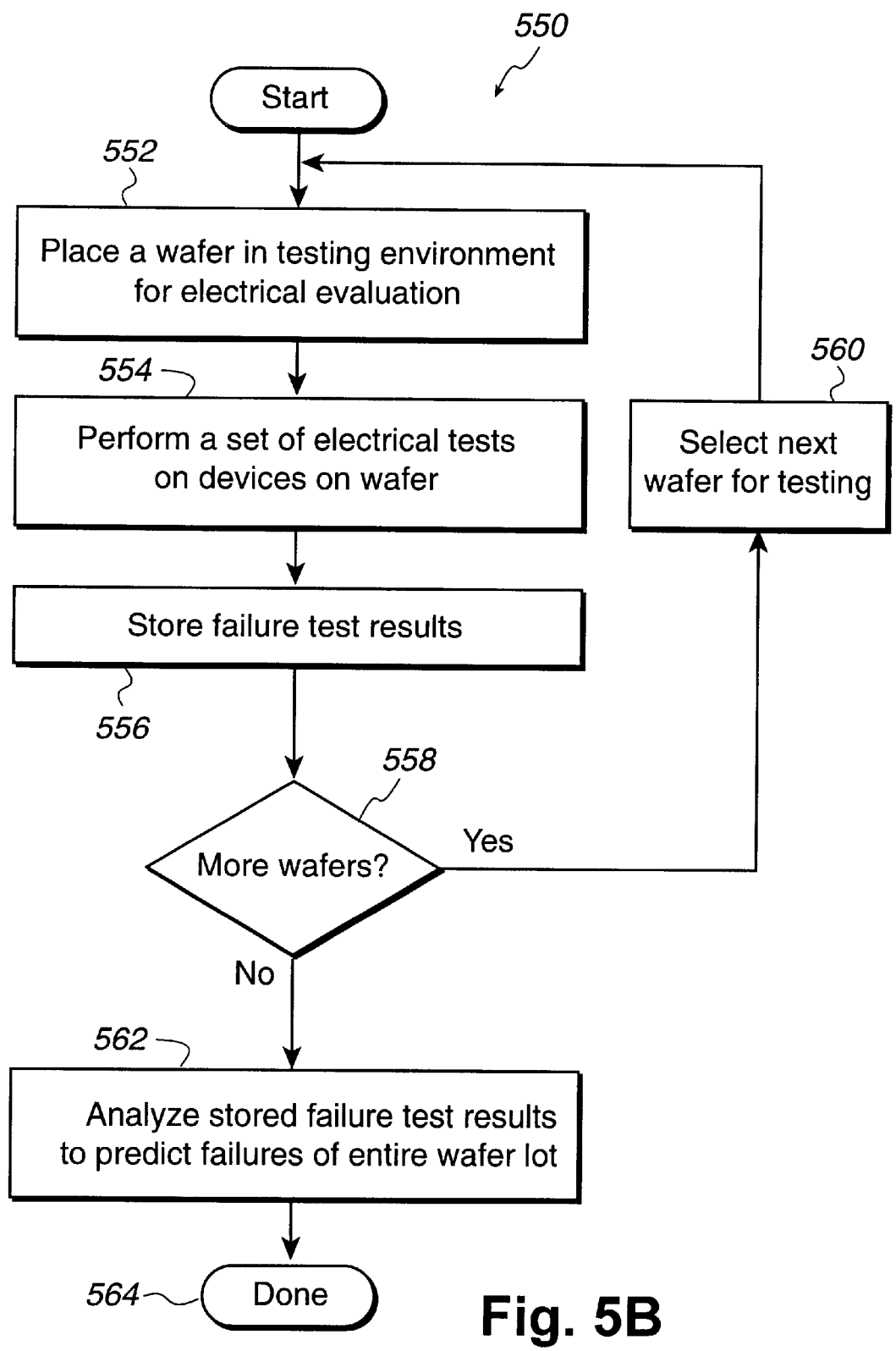
FIG. 5B illustrates a flowchart of an exemplary method for predicting failures while performing wafer electrical evaluation of an entire wafer lot that includes a plurality of wafers in accordance with one embodiment of the present invention.

In another embodiment, a semiconductor wafer lot of a set semiconductor wafers may be tested to predict reliability of the entire wafer lot. FIG. 5B illustrates a flowchart of an exemplary method for predicting failures of an entire wafer lot that includes a plurality of wafers. In this method, a wafer is selected and placed in a testing environment such as the testing apparatus 300 for electrical evaluation. Then, a set of electrical tests is performed on the individual semiconductor devices on the wafer in operation 554. The electrical test results are then stored and analyzed in a computer in operation 556. All wafers in the lot are electrically tested in accordance with normal production testing procedures by way of operations 558 and 560, and the results are stored in the tester. The results are then analyzed to determine if any wafers in the lot represent reliability risks and if special reliability evaluations are warranted.

When all the wafers in the wafer lot have been tested, the method proceeds to operation 562, where the stored electrical test results are processed to predict failures for the entire wafer lot. For example, based on the number of devices that have failed the failure tests and the total number of tested devices, a failure rate (i.e., percentage) of failed devices in each wafer in the wafer lot is determined. Then, the overall failure rate for the entire wafer lot is determined, for example, by averaging the failure rates of the wafers in the wafer lot. Alternatively, using conventional curve fitting methods, the failure rates of the wafers may be used to generate a failure rate plot from which the overall failure rate of the entire wafer lot can be determined. After generating the overall failure rate of the wafer lot, the method terminates in operation 564.

Figure 6A:
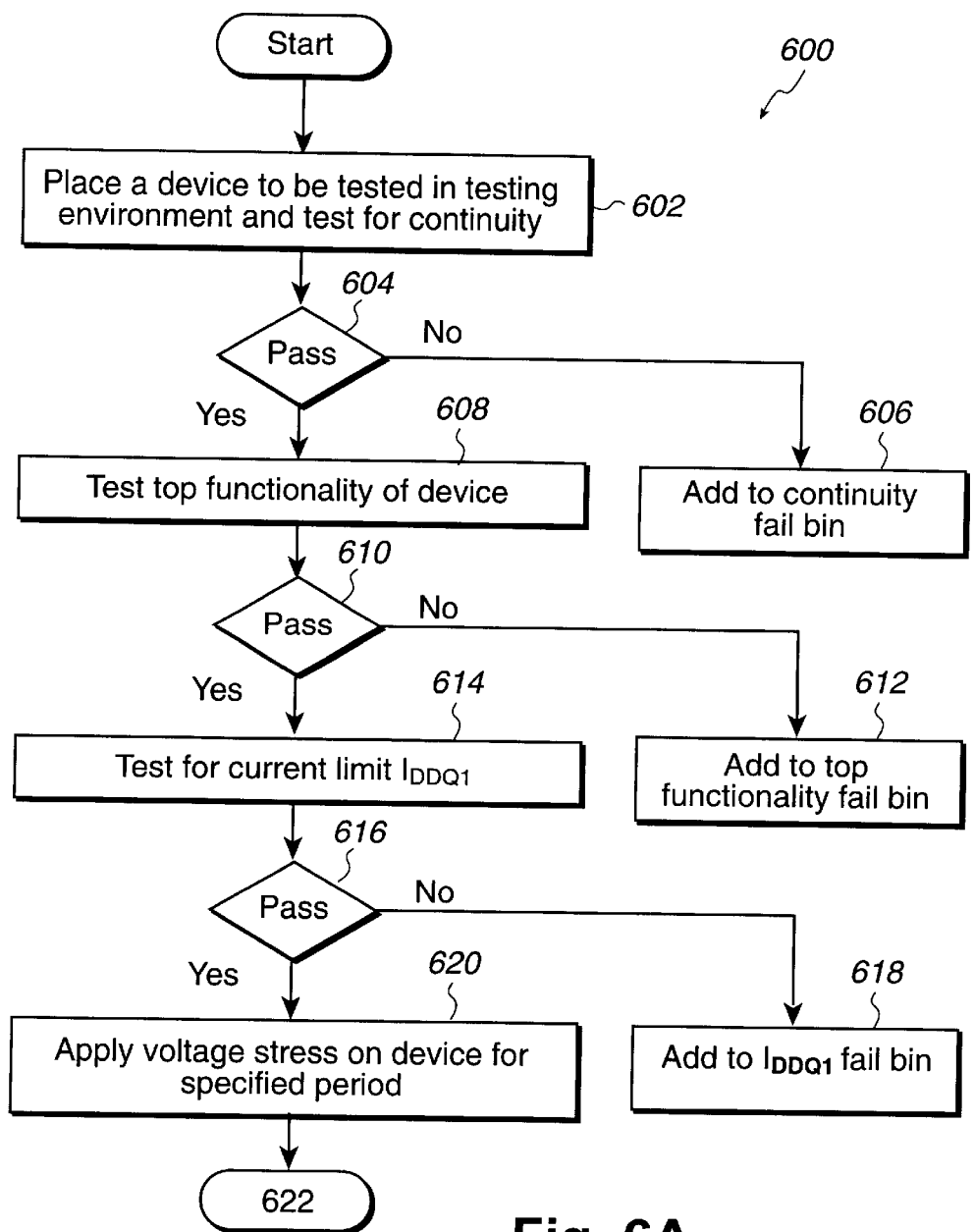
FIG. 6A shows a flowchart of an exemplary method for performing a set of electrical tests on semiconductor devices.

FIG. 6A shows a flowchart of an exemplary method 600 for performing a set of failure tests on semiconductor devices. It should be noted that the semiconductor devices may be tested individually, or as part of a wafer as illustrated in operations 504 and 554 of FIGS. 5A and 5B, respectively. In this method 600, a semiconductor device to be tested is selected and placed in a testing environment such as the testing apparatus 300, and is tested for continuity. In the continuity testing, electrical connections to the selected device are tested to ensure that all inputs and outputs are properly connected and conducting. In addition, it ensures that the probes are in proper electrical contact with the bonding pads of the semiconductor device. Then in operation 604, it is determined whether the semiconductor device passed the continuity test. If the device failed the continuity test, the method proceeds to operation 606, where the semiconductor device is added to a continuity fail bin. The continuity fail bin is used to keep track of the semiconductor devices that have failed the continuity test. It should be noted that when a device on a wafer fails a test and is placed in a fail bin, the device may be marked with an ink dot for visual identification of the defective device prior to wafer assembly.

After the semiconductor device has passed the continuity test, the method proceeds to operation 608 where the device is tested for top functionality. The top functionality test is used to verify that basic electrical performance parameters fall within acceptable limits. For example, the basic functionality of the semiconductor device may be tested in accordance to a data sheet describing the specification of the device. Then in operation 610, it is determined whether the semiconductor device has passed the top functionality test. If the device has failed the test, the method proceeds to operation 612 where the semiconductor device is added to a top functionality fail bin to keep track of the devices failing the top functionality test.

However, if the device has passed the top functionality test, the method proceeds to operation 614 where the semiconductor device is tested for a quiescent leakage current, $I_{DDQ1}$. In this test, the quiescent leakage current $I_{DDQ1}$, is measured and tested to ensure that it has not exceeded a specified value, which is often available from the data sheet of the device. The quiescent leakage current $I_{DDQ1}$, is a critical parameter for the performance of the device. However, it should be appreciated that any other critical parameters such as voltage levels that are deemed to be critical to the performance of devices may also be used in addition to or in lieu of the quiescent leakage current in this method. Then in operation 616, it is determined whether the measured quiescent leakage current $I_{DDQ1}$ has exceeded the specified current value. If so, the method proceeds to operation 618, where the semiconductor device is added to critical parameter $I_{DDQ1}$ fail bin to keep track of the devices that have failed the $I_{DDQ1}$ test.

When the device has passed the critical parameter $I_{DDQ1}$ test, the method proceeds to operation 620 where voltage stressing is applied to the device for a specified period. The voltage stressing is performed to determine how well the device can withstand higher voltage stress for the specified time. In one embodiment, the stress voltage is applied for a nominal time such as less than one second. This time is influenced by the cost of tester time in a production environment. However, it should be appreciated that the device may be subjected to any desired period of voltage stressing if tester cost considerations are waived. Preferably, the applied elevated voltage is less than a voltage that can cause the well-known Fowler-Nordheim tunneling effect in the gate oxide of the device. In one embodiment, voltage stressing is applied such that approximately 7 Megavolt/cm across the gate oxide is not exceeded. In addition, the applied elevated voltage is preferably less than approximately half the gate oxide breakdown voltage of gate oxides in the semiconductor devices. In one embodiment, the voltage level is determined so that limiting voltages for the wafer fabrication process (e.g., n and p channel $BV_{DSS}$, field threshold voltages, and gate oxide breakdown voltage) are not exceeded.

By way of example, for a semiconductor device designed to operate at 5 volts may be stressed by applying an 8-volt voltage for about 200 milliseconds. The voltage stressing accelerates the failures latent in the device. For instance, applying an elevated voltage of 8 volts for the device in the example may provide an acceleration factor of approximately 10 when applied for 200 milliseconds. This is equivalent to operating the semiconductor device in a field condition for approximately two seconds.

In voltage stressing, the elevated voltage is preferably selected so that new failure modes are not created in the semiconductor devices that would not be seen in normal operating conditions. Although the preferred embodiment applies voltage stressing to the semiconductor device for a nominal period of time, the voltage stressing can be applied for as long as desired for testing the device without creating new failure modes. For example, the voltage stressing operation can be performed for a period of time that is less than a time to burn-in the semiconductor device to realize the economic benefit of using the methods of the present invention.

Figure 6B:
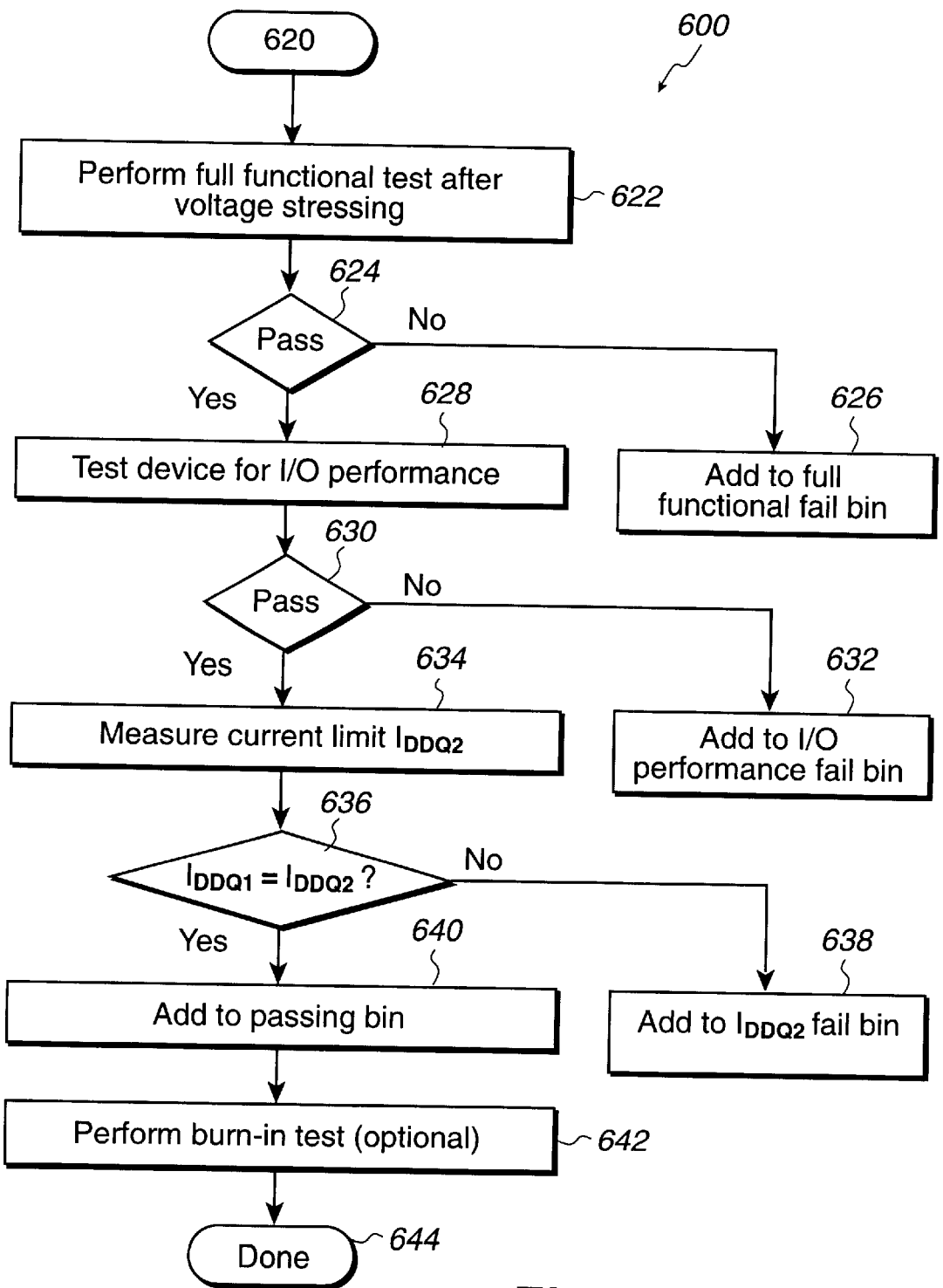
FIG. 6B illustrates a flowchart of the method of FIG. 6A after performing the voltage stressing in accordance with one embodiment of the present invention.

FIG. 6B illustrates a flowchart of the method 600 after performing the voltage stressing in accordance with one embodiment of the present invention. After performing the voltage stressing, a full functional test is performed on the semiconductor device in operation 622. In this test, detailed functional patterns are applied to the device to check for failures at normal operating voltage of the device. These functional patterns are designed to create high levels of "fault coverage." The coverage of the nodes commonly known as "fault coverage" is designed to exercise (i.e., test) as many of the voltage nodes as is practicable within the constraint of the testing device. If the device has failed the full functional test, the method proceeds to operation 626, where the failed device is added to a full functional test fail bin, which keeps track of the devices that have failed the full functional test.

If the device has passed the full functional test, it is tested for input and/or output electrical performance. This test ensures, for example, that output drive current, input voltage level sensitivities, and I/O leakage currents meet design requirements. If the device has failed the I/O performance test, the device is added to an I/O performance fail bin in operation 632. The I/O performance fail bin tracks the devices that have failed the I/O performance test.

After the device has passed the I/O performance test, a quiescent leakage current $I_{DDQ2}$ is measured in operation 634. The quiescent leakage current $I_{DDQ2}$ differs from the quiescent leakage current $I_{DDQ1}$ in that the $I_{DDQ2}$ is measured after the voltage stressing operation 620. As with $I_{DDQ1}$ any other parameter deemed to be critical to the performance of the device may be used in this method.

Once the quiescent leakage current $I_{DDQ2}$ has been measured, the method proceeds to operation 636, where the measured quiescent leakage currents $I_{DDQ1}$ and $I_{DDQ2}$ are compared. If the voltage stressing has caused no damage, the $I_{DDQ2}$ will approxinmately equal $I_{DDQ1}$ within the limits of the testing device. However, if the voltage stressing has induced a failure in the device, the $I_{DDQ2}$ will not be the same as $I_{DDQ1}$. For example, the $I_{DDQ2}$ may be significantly higher if the voltage stressing has caused a failure in the device. If the two $I_{DDQ}$ values are not approximately equal, then the method proceeds to operation 638 where the device is added to an $I_{DDQ2}$ fail bin for keeping track of devices that have failed the $I_{DDQ2}$ test. In another embodiment, rather than comparing $I_{DDQ2}$ with $I_{DDQ1}$, if the value of $I_{DDQ2}$ exceeds the $I_{DDQ1}$ test limit, this is treated as an $I_{DDQ2}$ failure.

If the device has passed the $I_{DDQ2}$ test, the method proceeds to operation 640 where the device is assigned to a passing bin. The passing bin keeps track of the devices that have passed all the tests in method 600. Then, an optional burn-in test may be performed to provide for additional reliability screening. If the optional burn-in test is performed, then the test is preferably performed for substantially less duration than conventional burn-in tests. The method then terminates in operation 644.

The measurement and evaluation of quiescent leakage currents before and after voltage stressing serves as an early predictor of product operating life reliability. In preferred embodiments, these evaluations are performed at both the individual wafer and wafer lot level to assess the reliability of assembled parts. The use of accelerated voltage along with elevated temperature allows more rapid determination of the correlation between wafer level results and assembled product reliability when performing dynamic operating life tests. While burn-in (BI) continues to be used as a reliability screen for some IC products, the use of statistical fail and passing bin results to predict product reliability reduces and may even eliminate the level of BI required on such products. Accordingly, the present invention minimizes cost and time in the manufacturing flow without potentially deleterious effects of added handling caused by the BI process.

By way of example, a wafer with a 0.6μ feature size CMOS process having three layers of metallization and a nominal gate oxide thickness of 125 angstroms was evaluated to determine its failure rate. Application of the above considerations for stress voltage selection resulted in a value of 8.0 V, applied to $V_{DD}$ and inputs, being chosen. Typically, the maximum voltage applied during wafer probe and final testing is 5.5 V. Subsequent dynamic burn-ins to determine operating life reliability were conducted at values of both 7.0 and 5.5 V. The measurement sequence during wafer probe testing is illustrated in FIGS. 6A and 6B described above.

A total of sixteen wafers from seven different wafer fabrication lots was evaluated. The product evaluated is a random logic device having a die size of 227×229 mil$^2$. The stress voltage is applied to the device by running the functional pattern at 8.0 V for ~200 ms. The quiescent leakage currents $I_{DDQ1}$ and $I_{DDQ2}$, before and after voltage stress, respectively, were measured to a limit of 250 μA. The $I_{DDQ2}$ failure bin was a critical parameter obtained from this measurement, since this represents parts that were sufficiently weak that an $I_{DDQ}$ failure was induced by the 200 ms voltage stress. If $I_{DDQ2}$ failure numbers are excessively high on particular wafers, parts assembled from these wafers are potential reliability risks. Wafers spanning the range of $I_{DDQ2}$ values measured for the seven lots were selected for assembly, although most wafers tended to be grouped toward the low end of the distribution.

To assess the reliability of IC's built from each of the 16 wafers evaluated, several hundred samples were assembled into the 128 pin quad flat package used for this product. They were subjected to dynamic operating life testing at an ambient temperature of 125° C. One hundred and fifty pieces from each wafer, 2400 total parts, were placed on operating life test at a $V_{DD}$ supply level of 7.0 V for 200 h, with intermittent read points at 6, 42, 100, and 150 h. To corroborate the results from the 7.0 V stress tests and estimate the acceleration achieved, a similar number of samples (2189) was subjected to operating life testing at $V_{DD}$=5.5V for 1048 h, with a total of nine intermittent read points. Representative samples of failing units from each voltage stress group were analyzed to determine the cause of failure.

Figure 7:
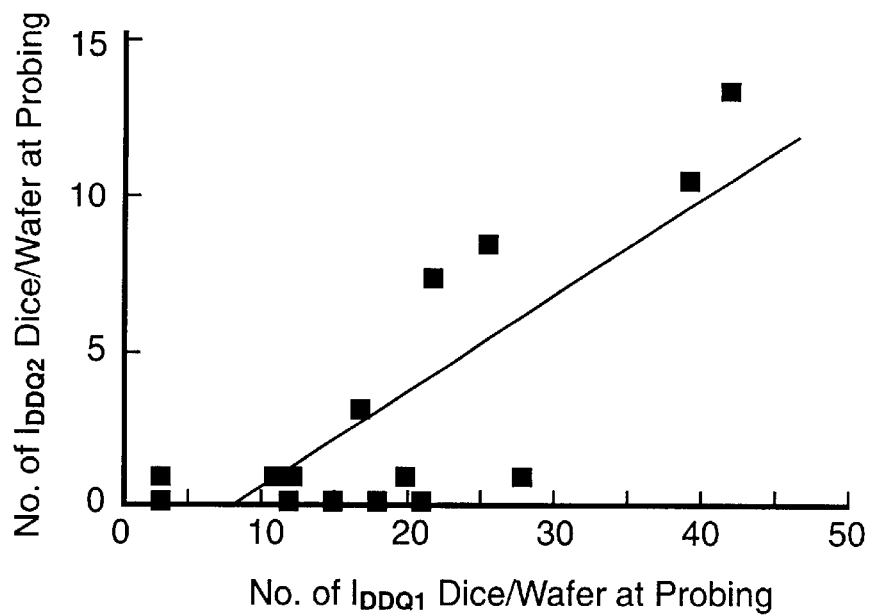
FIG. 7 shows that a correlation exists between the before and after voltage stress $I_{DDQ}$ failures for sixteen wafers.
Figure 8:
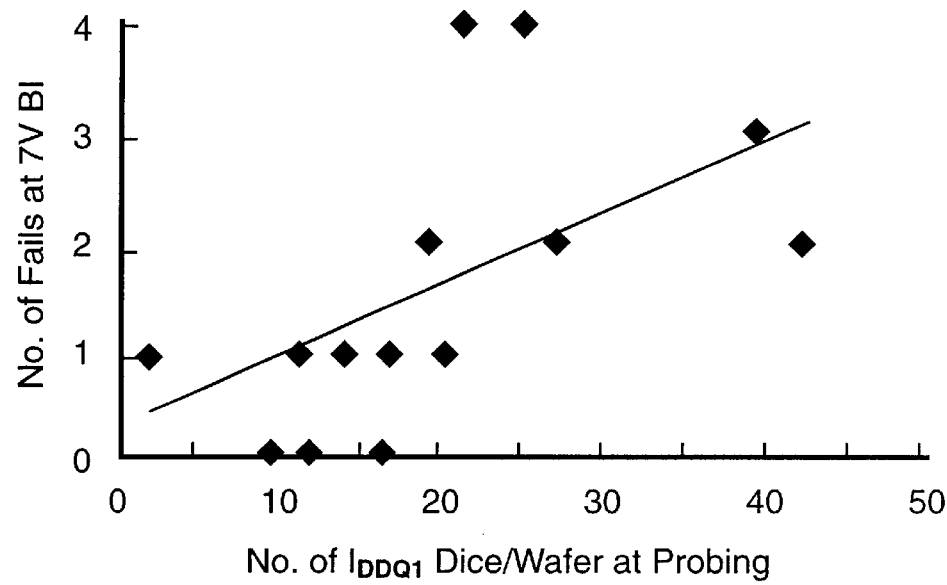
FIGS. 8 and 9 show a variation of total failures during the 7.0 V operating life test versus the wafers' before and after stress $I_{DDQ}$ values, respectively.
Figure 9:
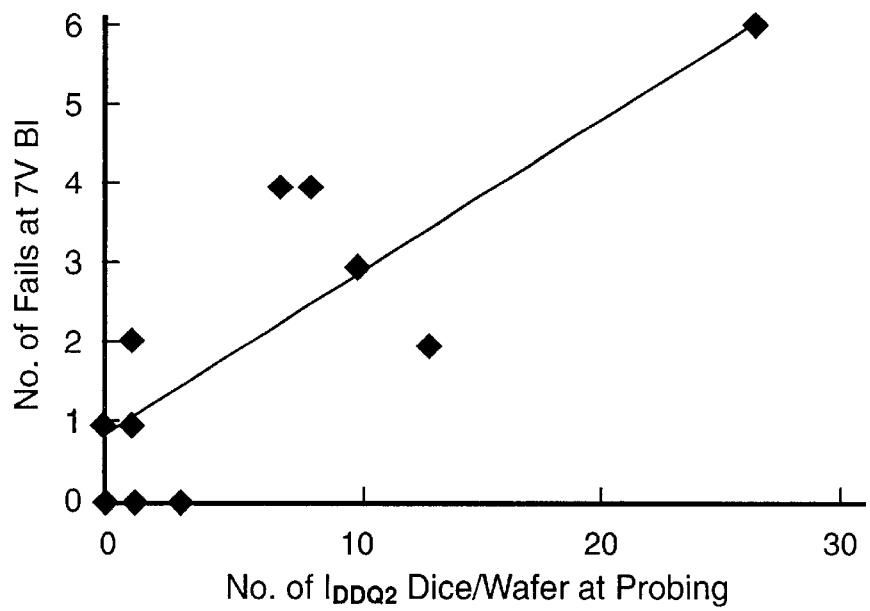

FIG. 7 shows that a correlation exists between the before and after voltage stress $I_{DDQ}$ failures for the 16 wafers evaluated. FIGS. 8 and 9 show the variation of total failures during the 7.0 V operating life test versus the wafers' before and after stress $I_{DDQ}$ values, respectively. The straight line fit for FIG. 9 appears to be better than that for FIG. 8, which is supported by the fact that the correlation coefficient r is 0.83 for FIG. 9 and 0.57 for FIG. 8. To test the validity of the relationship shown in FIG. 9, its r value was calculated without including the extreme (26,6) point, which strongly supports the dependence of operating life failures versus post stress $I_{DDQ}$ failures. In this case, r decreased somewhat, from 0.83 to 0.71. The 5.5 V BI cumulative failures/wafer versus $I_{DDQ2}$ value/wafer shows a similar shape to FIG. 9, but it has a much poorer r value, 0.27. This may be due to fewer points being available to create the curve, and possibly the variations, which occur during random sampling.

To find another in-process measurement that might correlate with finished product reliability, measurements were made using a ramped voltage technique on the scribe line gate oxide capacitors. Each probe site contained two area capacitors measuring 100×1800 μ$^2$, one over p well and one over n well. A gate oxide capacitor failure was defined as R<100 KΩ measured at 1 MV/cm, before a ramped stress voltage exceeds 12 V across the oxide, biased for substrate carrier accumulation. In an effort to measure an area comparable to the gate oxide area under poly on the product die, 29 pairs of capacitors/wafer were measured, giving a total gate oxide area/wafer of 0.1 cm$^2$. No strong correlation was observed between $I_{DDQ2}$ failures and the capacitor failure rate, although the wafer with the greatest number of $I_{DDQ2}$ failures also had the greatest number of oxide capacitor failures. The results by wafer of capacitor and $I_{DDQ2}$ failures are shown in following Table I.

TABLE I

| Wafer No. | Gate Oxide P-well | Failures N-well | No. of $I_{DDQ}$ Dice/Wafer |
| --- | --- | --- | --- |
| a | 0 | 0 | 0 |
| b | 0 | 0 | 0 |
| c | 0 | 0 | 0 |
| d | 0 | 1 | 0 |
| e | 1 | 0 | 0 |
| f | 0 | 0 | 1 |
| g | 0 | 1 | 1 |
| h | 0 | 0 | 1 |
| i | 0 | 0 | 1 |
| j | 0 | 0 | 1 |
| k | 1 | 0 | 3 |
| l | 0 | 0 | 7 |
| m | 0 | 0 | 8 |
| n | 0 | 0 | 10 |
| o | 2 | 0 | 13 |

Figure 10:
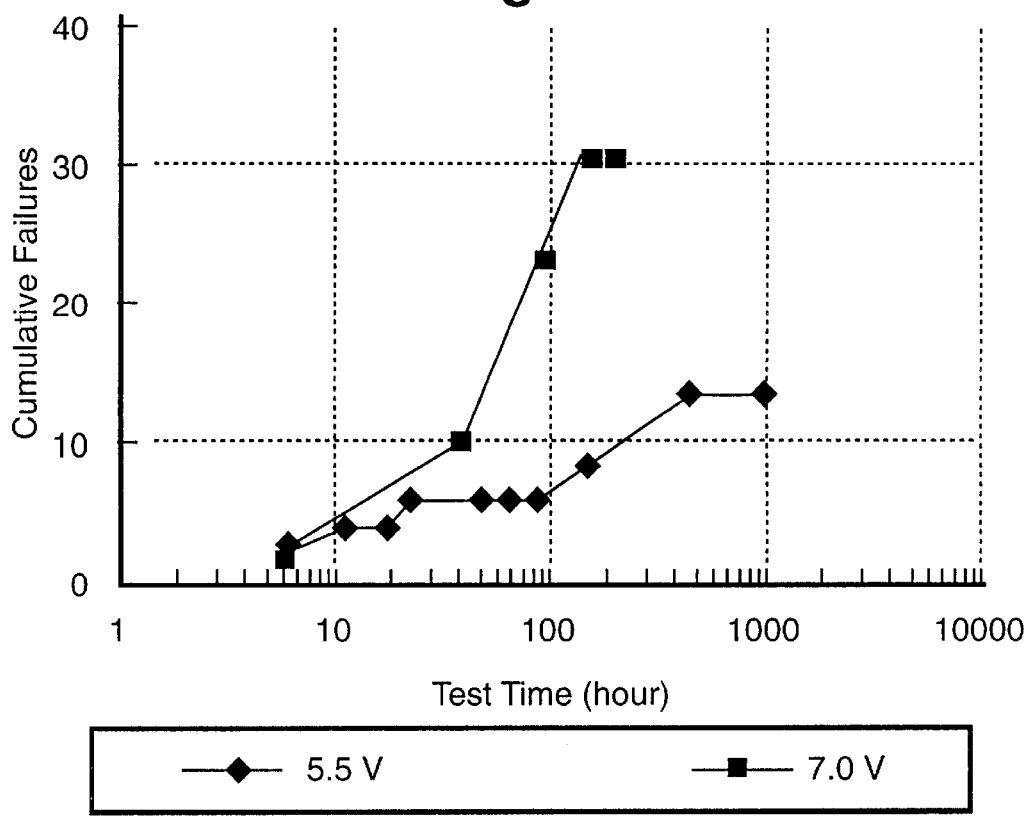
FIG. 10 is a graph of the cumulative failures during the course of operating life burn-in for the groups burned-in at 5.5 and 7.0 V.

FIG. 10 is a graph of the cumulative failures during the course of operating life BI for the groups burned-in at 5.5 and 7.0 V. The graph shows the effects of burning units in at supply voltages in excess of the maximum operating voltage, 5.5 V. Each group contained similar sample sizes taken from the same 16 wafers. The plot shows similarly shaped curves for the two groups, but about twice as many failures occurring in ⅕ the time for the 7.0 V group. Examination of the electrical signature for the failing units indicated that high $I_{DDQ}$ was a dominant characteristic for both groups, appearing on 86% of the failing units stressed at 7.0 V and on 71% of the failing units stressed at 5.5 V. It is believed that the root cause of these failures was related to localized conduction through the gate oxide, most frequently on p-channel devices.

In another case, an evaluation on a wafer lot was performed on a CMOS process similar to the above wafers but at a different and unrelated wafer fabrication facility. In this case, the die size was 259×241 mil$^2$, and the gate oxide thickness at 120 angstroms was slightly less than the thickness in the previously described process. One feature of the evaluation of this product prior to shipment is that the devices are voltage stressed at wafer probe at 7.5 V and 170 ms and the population of the after stress $I_{DDQ2}$ bin is monitored in a manner similar to the method described in FIGS. 6A and 6B. Another feature of this evaluation is that one hundred assembled units from each wafer lot receive dynamic burn-ins and 6.5 V and TA=125° C. for 24 hours to detect any significant early life failure effects.

This case was evaluated to establish a relationship between the $I_{DDQ2}$ failures and burn-in failure rate/lot on 38 consecutively processed wafer lots. Within this time period, a group of eight lots, all fabricated within an even shorter time period, exhibited burn-in fallout at a much higher level than the normal distribution for this product.

Figure 11:
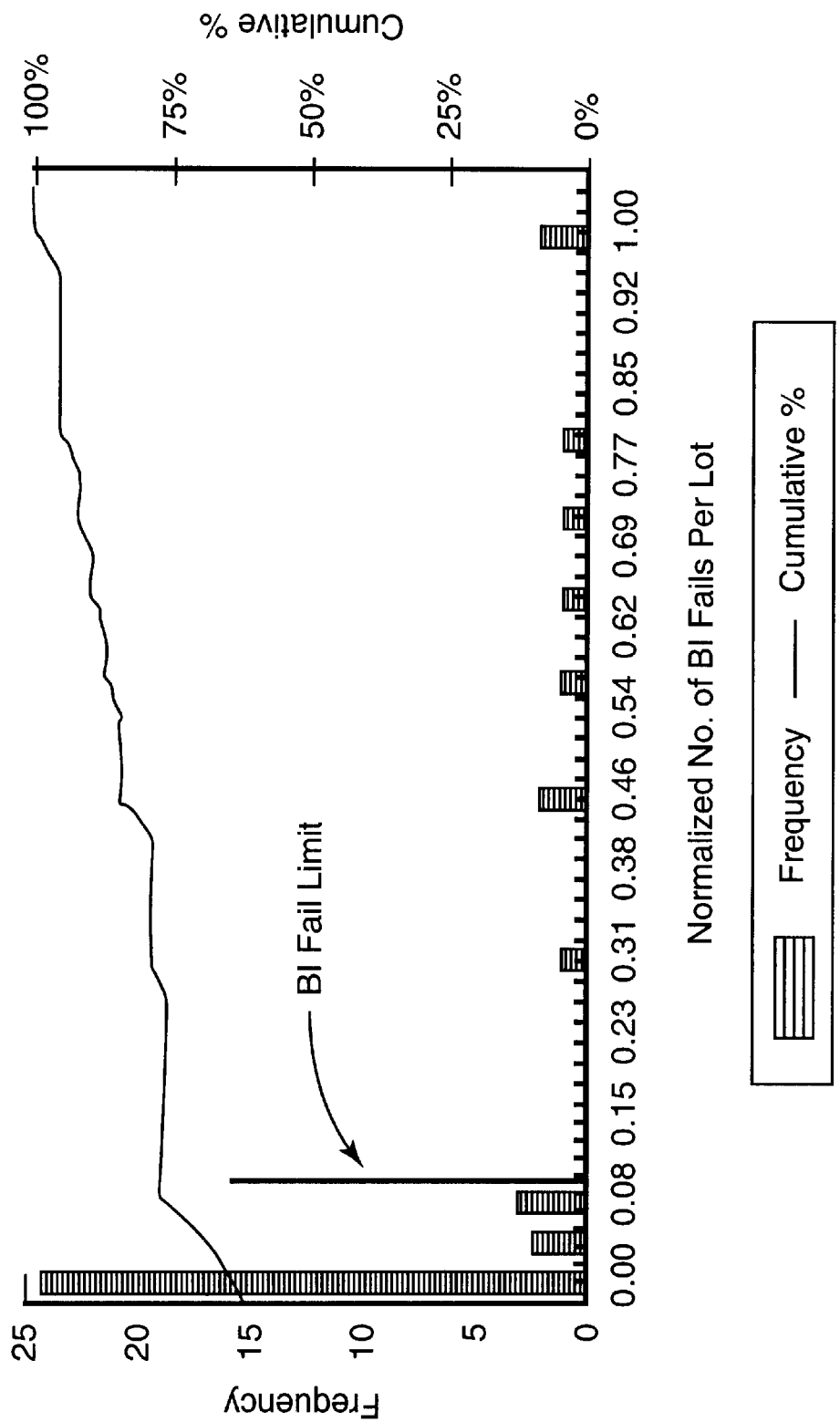
FIG. 11 shows a frequency of occurrence of burn failure for evaluated wafer lots.

The effectiveness of the $I_{DDQ2}$ screen on the anomalous material from these eight lots is shown in FIG. 11, which shows the frequency of occurrence of BI failure for the lots being evaluated. All points to the right of the BI Fail Limit line are from the anomalous material, while the distribution to the left of this line represents the normal distribution for this product, with most of the population residing at zero fails/lot.

Figure 12:
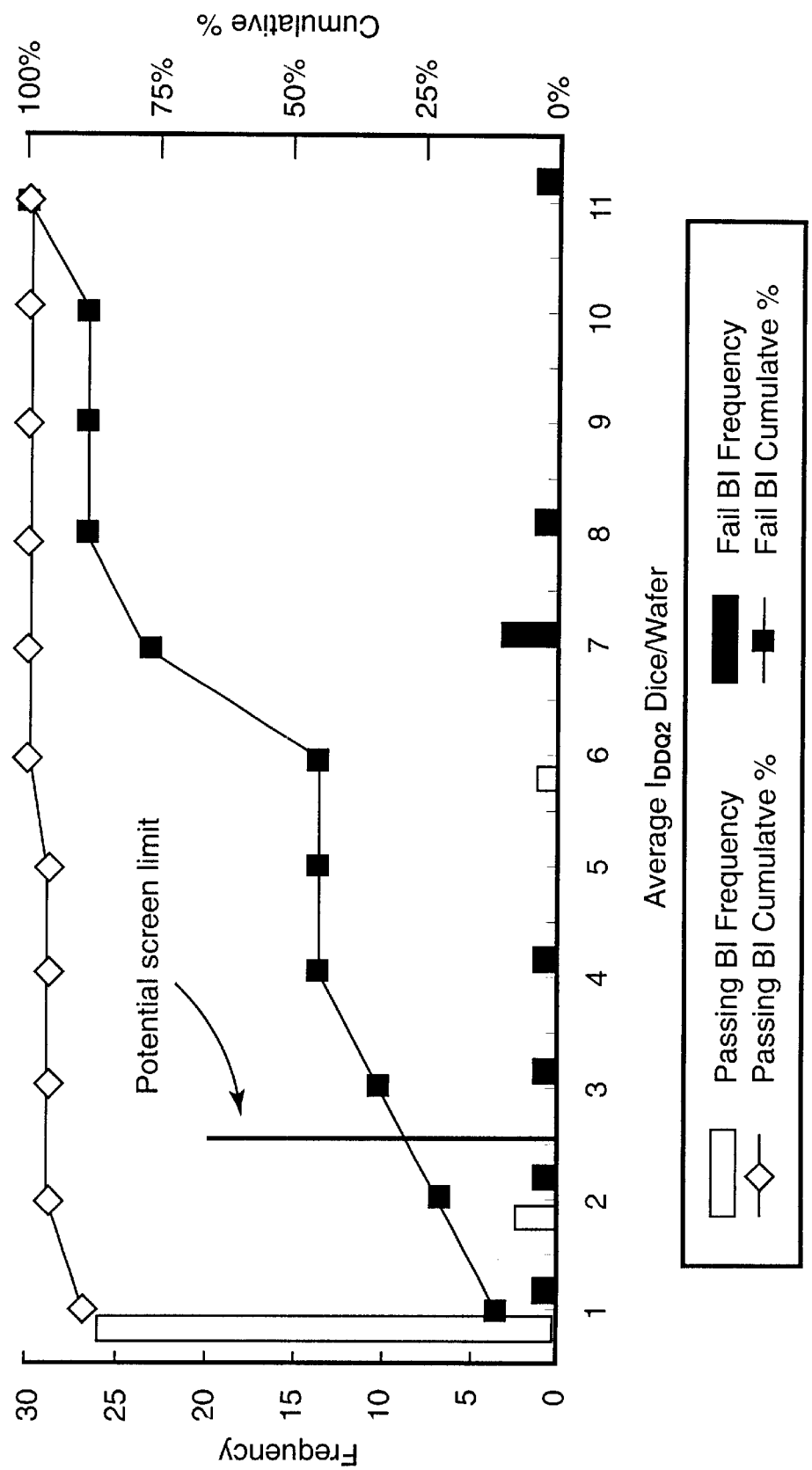
FIG. 12 shows a distribution of $I_{DDQ2}$ failures/wafer for the normal lots and the anomalous lots.

The histogram depicted in FIG. 12 shows the distribution of $I_{DDQ2}$ failures/wafer for the normal lots and the anomalous lots. If a lot average screening limit were to be set in the 2–3 dice/wafer range, the $I_{DDQ2}$ failing limit would serve as a good indicator of a BI lot's likelihood of passing. The following Table II lists some of the parameters obtained from analyzing the data from a study where the $I_{DDQ2}$ failing limit is set at $\geq 3$ dice/wafer.

TABLE II

|  | $I_{DDQ2}$ Bin < 3 | $I_{DDQ2}$ Bin $\geq$ 3 |
|---|---|---|
| Mean | 0.73 | 6.63 |
| Standard Deviation | 0.64 | 2.45 |
| Minimum | 0 | 3 |
| Maximum | 2 | 11 |
| # Lots | 30 | 8 |
| Success Factor | P[pass BI] = 93% | P[fail BI] = 88% |

One of the notable parameters shown in Table II is a success factor. The success factor is defined as the probability that a wafer lot having an average $I_{DDQ2}$ failure rate of <3 dice/wafer will pass BI and that a lot with a >3 average $I_{DDQ2}$ failure rate will fail BI. The success factor values shown are 93% and 88%, indicating that the wafer sort value of $I_{DDQ2}$ may be a strong predictor of operational reliability. Similar to the previous wafer-level evaluation, a large percentage of the electrical failures were for $I_{DDQ}$ exceeding a limit of 300 $\mu$A, and the dominant physical failure mechanism was again identified as gate oxide leakage.

The results which have been described from two independent evaluations indicate that the distribution of $I_{DDQ}$ failures after voltage stressing at wafer probe can be a good indicator of the expected field reliability of product assembled from a given wafer. Even if voltage stressing is not employed, statistically monitoring the distribution of the basic $I_{DDQ}$ bin can provide additional insight into final product reliability as shown in FIG. 8.

The improved correlation of reliability performance with after stress $I_{DDQ}$ failures is as follows. The initial measurement of $I_{DDQ}$ is used to reject devices that may be failing due to a variety of random defects. Using a conservative voltage acceleration factor, an 8 V stress will provide an acceleration of approximately 50 times the stress that is received during normal 5.5 V functional testing. Since many of the random defect failures may have been removed by the initial $I_{DDQ}$ measurement, the more intense stressing provided by 8 V may be focused on attacking any existing residual failure mechanisms. In the examples presented herein, a dominant failure mechanism was found to be the cause of most of the operating life failures.

The fact that no strong correlation was obtained from scribeline gate oxide monitors with voltage stress induced $I_{DDQ}$ failures shown in Table I above is not too surprising. The total gate oxide area stressed, ~0.1 cm$^2$, from 29 pairs of capacitors is only equal to approximately the poly-covered gate oxide area of one product die. Because of the physical constraints of creating large gate oxide capacitors in the scribeline, the main usefulness of these structures on an individual wafer basis appears to be in determining intrinsic oxide characteristics, rather than as a tool for monitoring random defects.

One unexpected result obtained was the effectiveness of a fairly small BI sample in providing a good indication of overall wafer lot reliability as Table II indicates with Passing Limit Set at <3 Dice/Wafer. The 100 piece burn-in sample is obtained, most likely, from one or possibly two of the more than 20 wafers comprising a lot. The distribution of post-stress failures in wafer lots having higher than normal average $I_{DDQ2}$ failures has been found to be due to just a few high valued wafers. Approximately 20% of the high valued wafers account for approximately 75% of the total lot $I_{DDQ2}$ failures. Therefore, it is likely that in the sample selection process, the units originated from a wafer having a relatively low number of $I_{DDQ2}$ failures. It is possible that this effect of units having reliability problems when assembled from seemingly good wafers from a lot with overall abnormal characteristics is related only to certain types of defects and certain steps in the manufacturing process.

In addition to the predictive capabilities of monitoring voltage stress induced $I_{DDQ}$ failures, another strong benefit is that it serves as a driver for improvements in the manufacturing area. Because root cause analysis of $I_{DDQ}$ failures often has a high success rate, using tools such as emission microscopy and hot spot detection techniques, problem wafers can be readily evaluated at the wafer manufacturing facility, and results can be quickly fed back to the appropriate areas in the fabrication facility for determination of any corrective measures that may be necessary. The time savings provided by this method are also useful during process development activities, provided that the stress voltage chosen is based on a good understanding of the voltage limitations of the dielectric materials and devices being used.

The results of the evaluations of operating life reliability performed at both 5.5 and 7.0 V, shown in FIG. 10, indicate that the same types of failures are induced at either of the two voltages and that time can be saved in performing reliability evaluations by using the higher voltage value. A voltage acceleration factor (VAF) has been estimated from the approximate failure rates at the two voltages. This value has been found to be 9.9, which results in a value of C=1.53 $V_{-1}$, when using the relationship $$VAF = e^{C(\Delta V)}$$

Where $\Delta V$ is the difference in the voltages being compared, in this case 7−5.5=1.5 V. A wide range of values for VAF have been reported, and the value obtained from this estimate has been found to be near the low end of this range, which is in agreement with some recent findings for gate oxide failure acceleration factors.

Two independent evaluations have been made of the effectiveness of stressing IC's at wafer probe at voltages in excess of their actual operating voltage to induce failures that may occur during IC operating life. Good correlation was found in both cases for the level of voltage stress induced $I_{DDQ}$ failures with simulated operating life reliability results at both the individual wafer and wafer lot level. Higher stress voltages should result in better resolution of reliability anomalies provided the inherent voltage limitations of the IC are not exceeded. Statistically monitoring the variation of the post-stress failures, along with other failure bins obtained during wafer probe, can provide important messages about when additional evaluation, or even scrapping, is warranted and when good reliability performance can be expected. This message is received prior to sending wafers to assembly and therefore provides an early warning signal at the wafer level on potential reliability issues. Occurrences of this type of message, especially if they become repetitive, provide a signal for the wafer manufacturing facility to understand and correct the cause of the stress induced failures. Because $I_{DDQ}$ failures often have a high failure analysis success rate, information can be rapidly obtained by the manufacturing facility and translated into identification of the source of reliability limiting defects and programs for their reduction or elimination.

While this evaluation was performed on 0.6 $\mu$ feature size CMOS products which operate at 5 V, the same methodology is being applied to more aggressive feature size technologies, such as 0.35 $\mu$ CMOS operating at 3.3 V. As feature sizes continue to be rapidly reduced, the usefulness of this approach as an early warning indicator should remain, as long as the considerations for choosing stress voltage conditions-based on good understanding of material and device characteristics-are observed.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for predicting reliability of semiconductor devices without undergoing a burn-in process, comprising:
    obtaining a set of semiconductor devices for testing, wherein each semiconductor device is capable of being tested to measure one or more critical parameters that indicate failure of associated semiconductor device;
    performing a set of electrical tests on each of the semiconductor devices to obtain a failure result for the critical parameter of each of the semiconductor devices, the set of electrical tests being performed both before and after stressing each of the semiconductor devices with an elevated voltage above a normal operating voltage for the semiconductor devices; and
    determining a failure rate for the set of semiconductor devices from the failure results of the semiconductor devices, wherein the failure rate indicates a probability of failure for the entire set of semiconductor devices.

2. The method for predicting reliability of semiconductor devices as recited in claim 1, wherein the operation of performing the set of electrical tests further comprises:
    testing each of the semiconductor devices to measure the critical parameter before applying the elevated voltage;
    applying the elevated voltage to each of the semiconductor devices for a specified period of time; and
    testing each of the semiconductor devices to measure the critical parameter after applying the elevated voltage.

3. The method for predicting reliability of semiconductor devices as recited in claim 2, wherein the one or more critical parameters includes a quiescent leakage current.

4. The method for predicting reliability of semiconductor devices as recited in claim 2, wherein the applied elevated voltage is less than a voltage that causes Fowler-Nordheim tunneling effect.

5. The method for predicting reliability of semiconductor devices as recited in claim 2, wherein each of the semiconductor devices includes one or more gate oxides, each of which exhibits a breakdown voltage, and wherein the applied elevated voltage is less than approximately half the gate oxide breakdown voltage.

6. The method for predicting reliability of semiconductor devices as recited in claim 2, wherein the specified period of time is less than a second.

7. The method for predicting reliability of semiconductor devices as recited in claim 2, wherein the specified period of time is less than a burn-in time.

8. The method for predicting reliability of semiconductor devices as recited in claim 2, wherein the semiconductor devices are disposed on a semiconductor wafer such that the failure rate is associated with the semiconductor wafer as a whole.

9. The method for predicting reliability of semiconductor devices as recited in claim 1, wherein the failure rate of the semiconductor wafer correlates to a burn-in failure of the devices present on the semiconductor wafer.

10. The method for predicting reliability of semiconductor devices as recited in claim 2, wherein the semiconductor devices are disposed on a plurality of wafers defining a wafer lot such that the failure rate is associated with the wafer lot as a whole.

11. A method for evaluating a failure rate of semiconductor wafers containing a plurality of semiconductor devices, comprising:
    selecting a semiconductor wafer for testing, wherein each semiconductor device in the selected semiconductor wafer is capable of being tested for measuring a critical parameter that indicates failure of associated semiconductor device;
    for each of the semiconductor devices in the selected semiconductor wafer,
        measuring the associated critical parameter under a normal operating voltage for the semiconductor devices;
        applying an elevated voltage above the normal operating voltage to each of the semiconductor devices for a specified period of time; and
        measuring the associated critical parameter after applying the elevated voltage; and
        comparing the measured critical parameters to obtain a failure result when the critical parameter measured after applying the elevated voltage is not approximately equal to the critical parameter measured before applying the elevated voltage; and
    determining a failure rate for the selected semiconductor wafer from the failure results of the associated semiconductor devices, wherein the failure rate indicates a probability of failure for the selected semiconductor wafer.

12. The method for predicting a failure rate of semiconductor devices as recited in claim 11, wherein the critical parameter is a quiescent leakage current.

13. The method for predicting a failure rate of semiconductor wafers as recited in claim 11, wherein the applied elevated voltage is less than a voltage that causes Fowler-Nordheim tunneling effect.

14. The method for predicting a failure rate of semiconductor wafers as recited in claim 11, wherein each of the semiconductor devices includes one or more gate oxides, each of which exhibits a breakdown voltage, and wherein the applied elevated voltage is less than approximately half the gate oxide breakdown voltage.

15. The method for predicting a failure rate of semiconductor wafers as recited in claim 11, wherein the specified period of time is less than a second.

16. The method for predicting a failure rate of semiconductor wafers as recited in claim 11, wherein the specified period of time is less than a burn-in time to burn in the devices present on the selected semiconductor wafer.

17. The method for predicting a failure rate of semiconductor devices as recited in claim 11, wherein each of the semiconductor wafers are selected and tested to determine the associated failure rate, wherein the associated failure rates for the semiconductor wafers are combined to obtain an overall failure rate for the semiconductor wafers.

18. A method for evaluating a failure rate of a wafer lot having a set of semiconductor wafers, each semiconductor wafer containing a plurality of semiconductor devices, the method comprising:

for each semiconductor wafer in the wafer lot,
  selecting a semiconductor wafer for testing, wherein each semiconductor device in the selected semiconductor wafer is capable of being tested for measuring a critical parameter that indicates failure of associated semiconductor device; and
  for each of the semiconductor devices in the selected semiconductor wafer,
    measuring the associated critical parameter under a normal operating voltage for the semiconductor devices;
    applying an elevated voltage above the normal operating voltage to each of the semiconductor devices for a specified period of time;
    measuring the associated critical parameter after applying the elevated voltage;
    comparing the measured critical parameters to obtain a failure result when the critical parameter measured after applying the elevated voltage is not approximately equal to the critical parameter measured before applying the elevated voltage; and
  determining a failure rate for the associated semiconductor wafer from the failure results of the semiconductor devices, wherein the failure rate indicates a probability of failure for the associated semiconductor wafer; and
determining an overall failure rate for the wafer lot from the failure rate of the semiconductor wafers, wherein the overall failure rate indicates a probability of failure for the entire wafer lot.

19. The method for evaluating a failure rate of a wafer lot as recited in claim 18, wherein the critical parameter is a quiescent leakage current.

20. The method for evaluating a failure rate of a wafer lot as recited in claim 18, wherein the applied elevated voltage is less than a voltage that causes Fowler-Nordheim tunneling effect.

21. The method for evaluating a failure rate of a wafer lot as recited in claim 18, wherein each of the semiconductor devices includes one or more gate oxides that exhibits a breakdown voltage, and wherein the applied elevated voltage is less than approximately half the gate oxide breakdown voltage.

22. The method for evaluating a failure rate of a wafer lot as recited in claim 18, wherein the specified period of time is less than a second.

23. The method for evaluating a failure rate of a wafer lot as recited in claim 18, wherein the failure rate is specified period of time is less than a time to burn-in the devices from the wafer lot.

24. The method for evaluating a failure rate of a wafer lot as recited in claim 18, wherein the overall failure rate of the wafer lot correlates to a burn-in failure of the devices in the wafer lot.

* * * * *